US012626894B2

(12) United States Patent
Shin et al.

(10) Patent No.: US 12,626,894 B2
(45) Date of Patent: May 12, 2026

(54) CARRIER FOR END EFFECTOR, TRANSPORTATION APPARATUS INCLUDING THE SAME AND THE SUBSTRATE PROCESSING APPARATUS

(71) Applicant: SEMES CO., LTD.,
Chungcheongnam-do (KR)

(72) Inventors: Jae Won Shin, Seoul (KR); Duk Hyun Son, Chungcheongnam-do (KR)

(73) Assignee: SEMES CO., LTD.,
Chungcheongnam-do (KR)

( * ) Notice: Subject to any disclaimer, the term of this patent is extended or adjusted under 35 U.S.C. 154(b) by 628 days.

(21) Appl. No.: 18/092,201

(22) Filed: Dec. 30, 2022

(65) Prior Publication Data

US 2023/0317434 A1 Oct. 5, 2023

(30) Foreign Application Priority Data

Apr. 1, 2022 (KR) ......................... 10-2022-0041027

(51) Int. Cl.
*H01J 37/32* (2006.01)
(52) U.S. Cl.
CPC .. *H01J 37/32807* (2013.01); *H01J 37/32642* (2013.01); *H01J 37/32715* (2013.01); *H01J 37/32816* (2013.01); *H01J 2237/1825* (2013.01); *H01J 2237/2007* (2013.01); *H01J 2237/20278* (2013.01); *H01J 2237/334* (2013.01)
(58) Field of Classification Search
USPC ...................................................... 156/345.32
See application file for complete search history.

(56) References Cited

U.S. PATENT DOCUMENTS

| | | | |
|---|---|---|---|
| 10,964,584 B2 * | 3/2021 | Volfovski | .......... H01L 21/68721 |
| 11,842,917 B2 | 12/2023 | Volfovski et al. | |
| 2015/0015014 A1 * | 1/2015 | Furuichi | .............. B25J 15/0616 |
| | | | 294/183 |

(Continued)

FOREIGN PATENT DOCUMENTS

| | | |
|---|---|---|
| JP | 2017-50484 | 3/2017 |
| KR | 10-2017-0054249 | 5/2017 |
| KR | 10-2090278 | 3/2020 |

(Continued)

OTHER PUBLICATIONS

Office Action dated Dec. 13, 2023 for Korean Patent Application No. 10-2022-0041027 and its English translation from Global Dossier.

*Primary Examiner* — Ram N Kackar
(74) *Attorney, Agent, or Firm* — WOMBLE BOND DICKINSON (US) LLP

(57) ABSTRACT

The transporting apparatus of the present invention comprises an end effector including a hand and a plurality of vacuum holes installed in the hand; and a carrier located on the hand and for supporting a consumable part, wherein the carrier comprises one side for supporting a consumable part, the other surface facing the hand of the end effector, and a plurality of support blocks installed on the other surface and corresponding to the plurality of vacuum holes, wherein an inner space communicating with the vacuum hole is installed in the plurality of support blocks, and the inner space is evacuated by negative pressure provided from the plurality of vacuum holes.

20 Claims, 15 Drawing Sheets

200A

(56)       References Cited

U.S. PATENT DOCUMENTS

2020/0273681 A1*   8/2020   Son ................... H01L 21/67383
2021/0351063 A1*   11/2021   Sarode Vishwanath .....................
                                                    H01J 37/32623

FOREIGN PATENT DOCUMENTS

KR      10-2021-0030917      3/2021
KR      10-2021-0156339      12/2021

* cited by examiner

[FIG. 1]
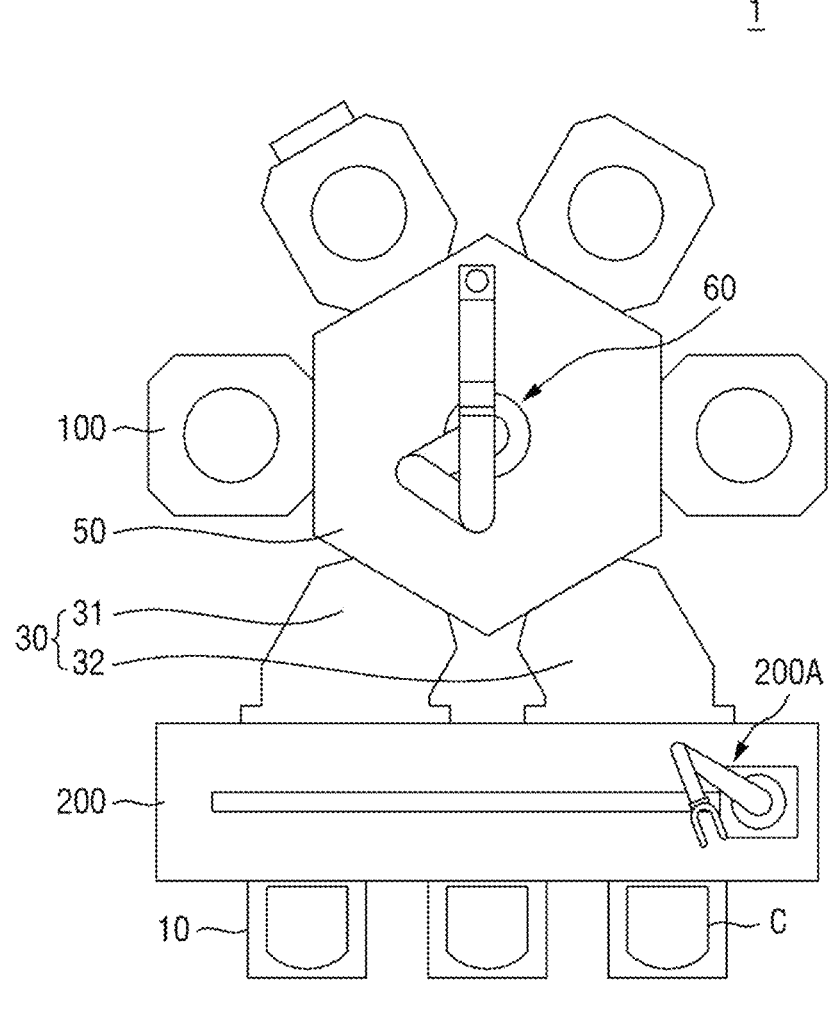

[FIG. 2]
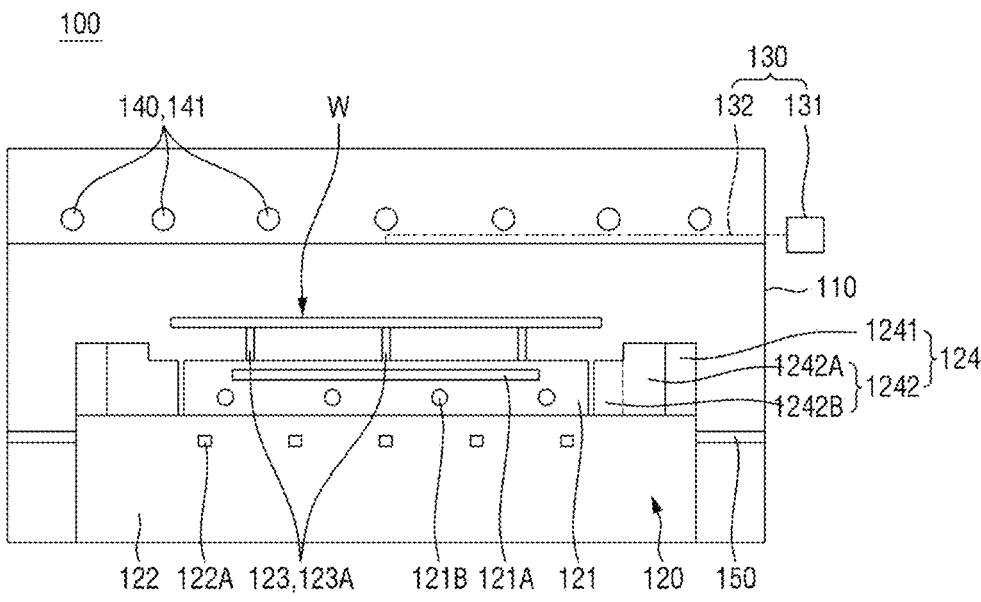

[FIG. 3]
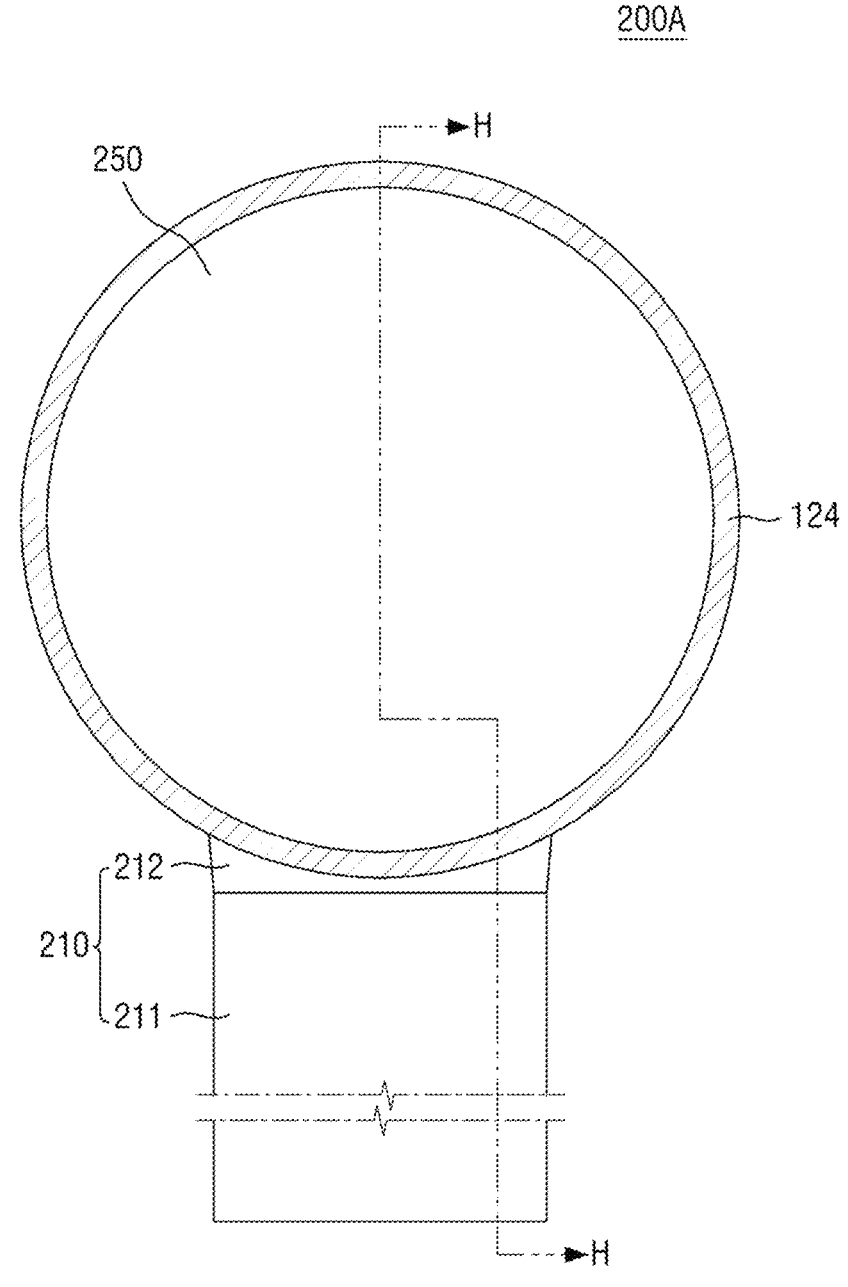

[FIG. 4]
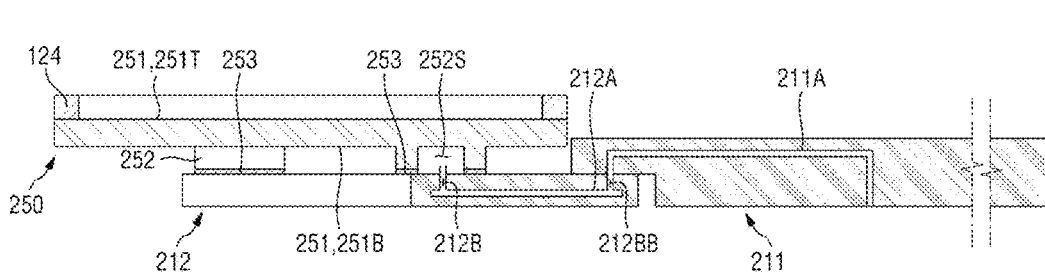

[FIG. 5]
212
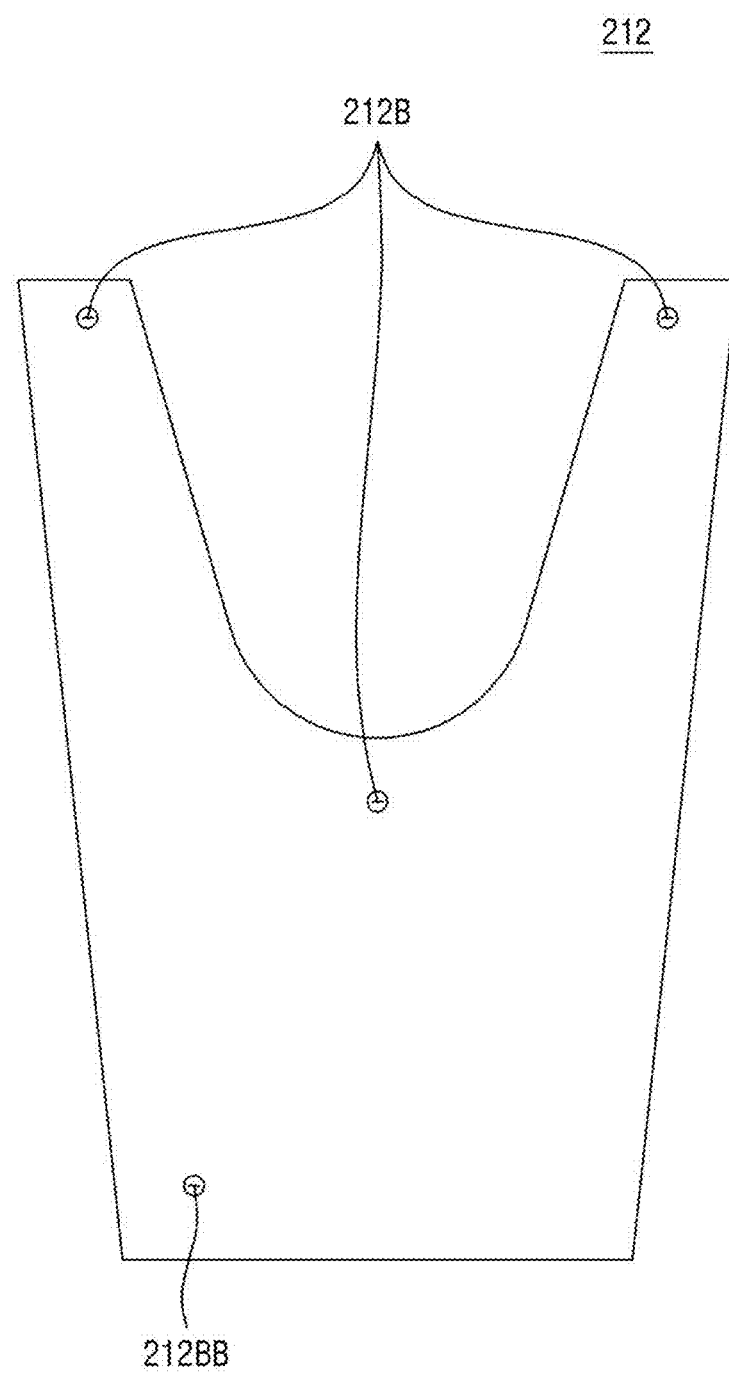
212B
212BB

[FIG. 6]
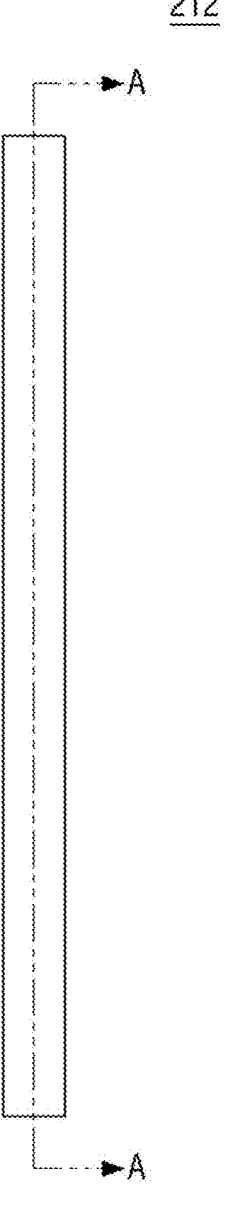

[FIG. 7]
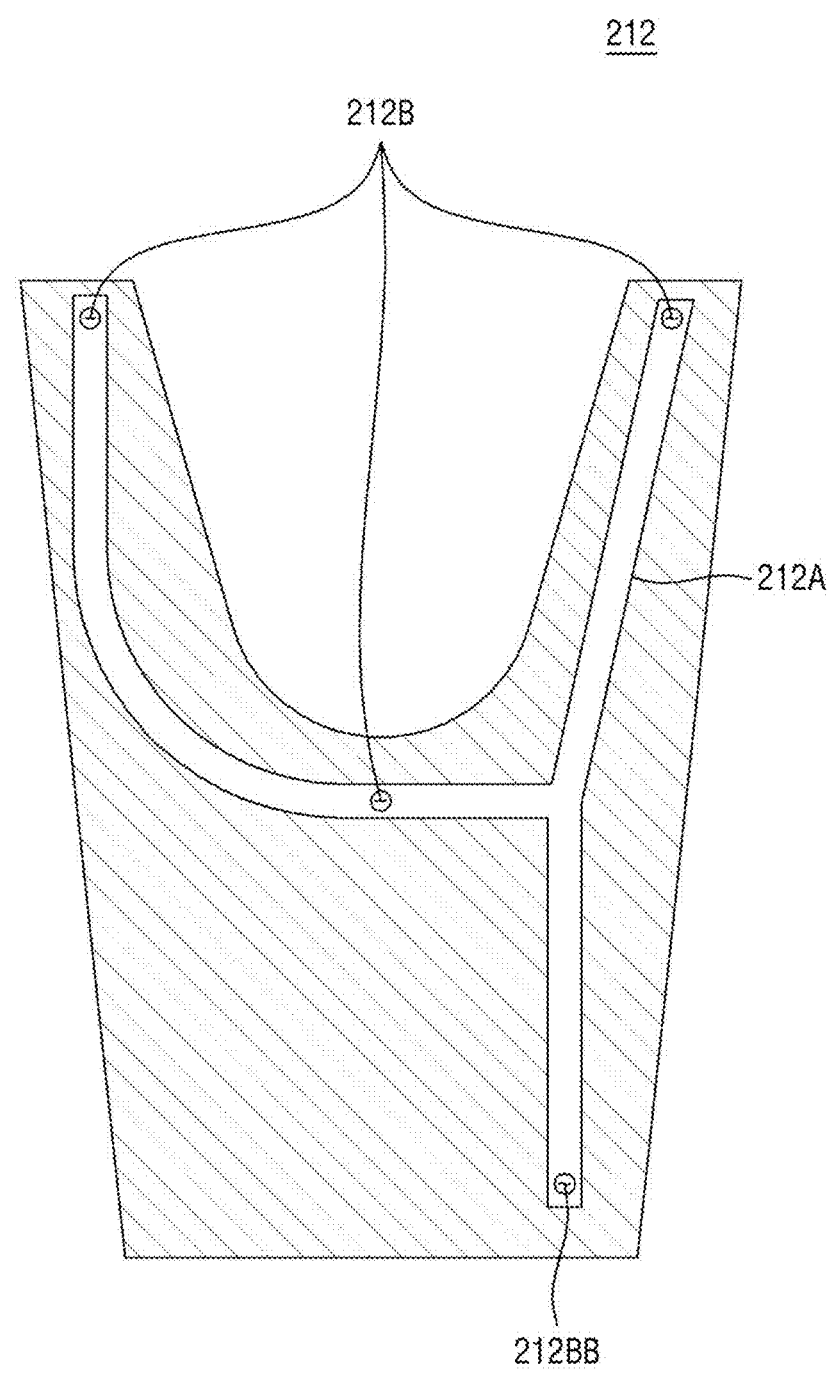

[FIG. 8]
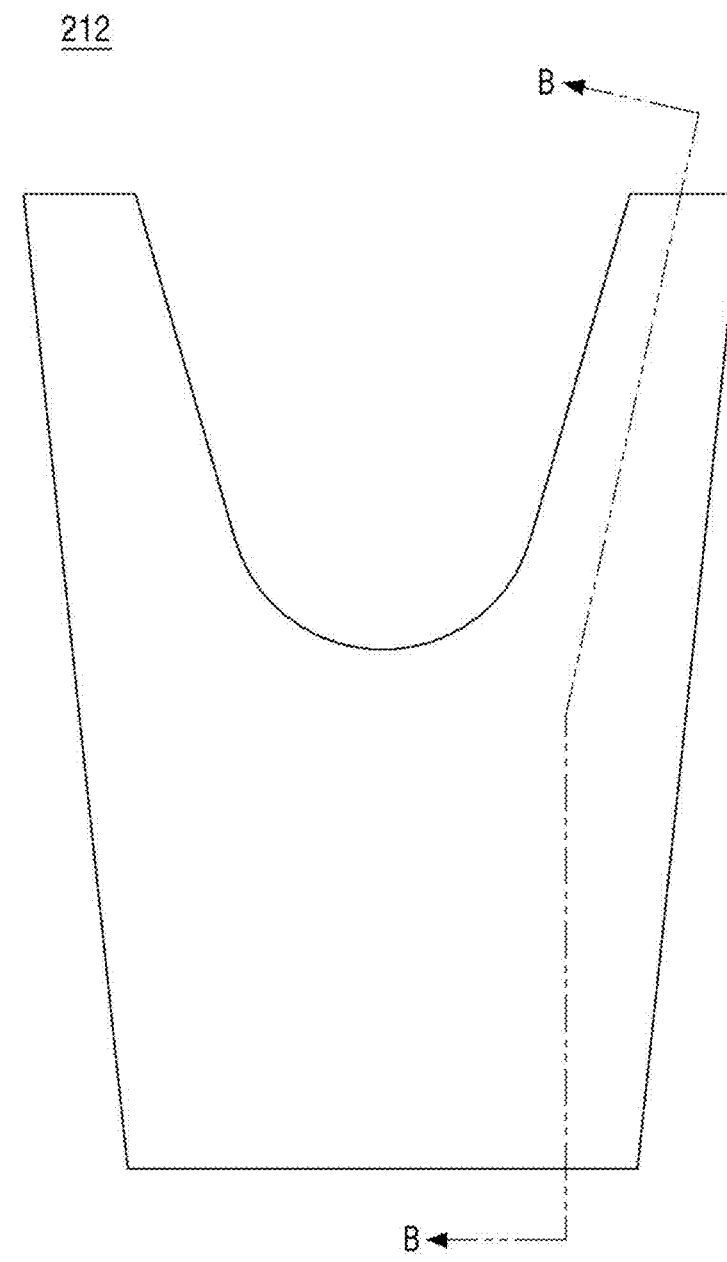

[FIG. 9]
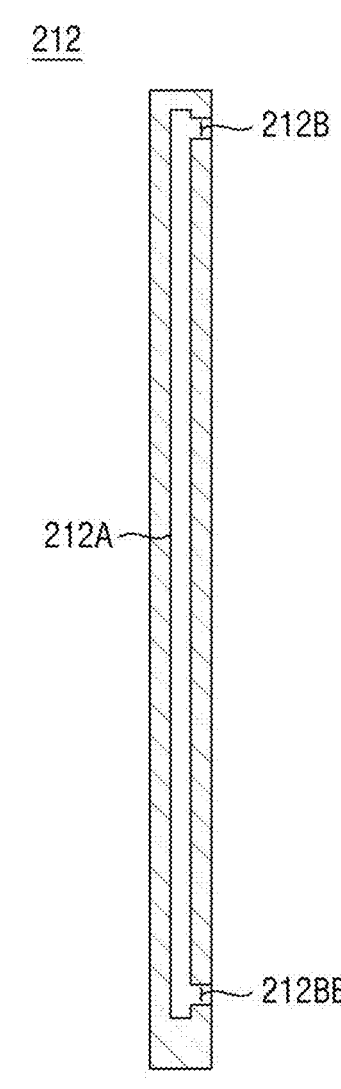

[FIG. 10]
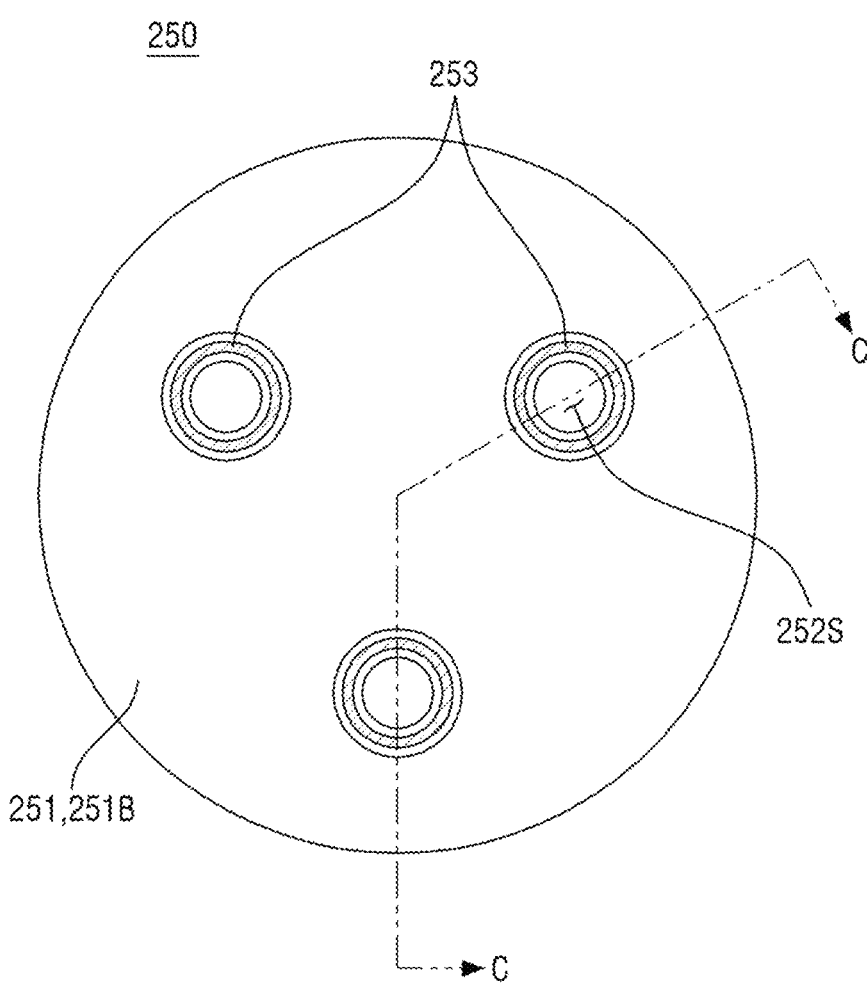

[FIG. 11]
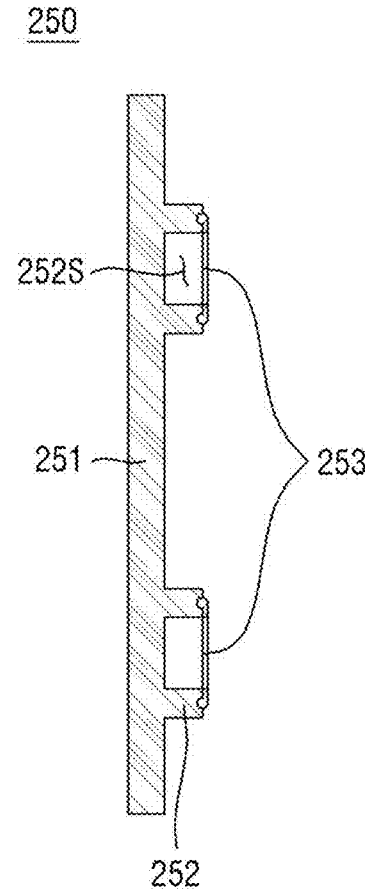

[FIG. 12]
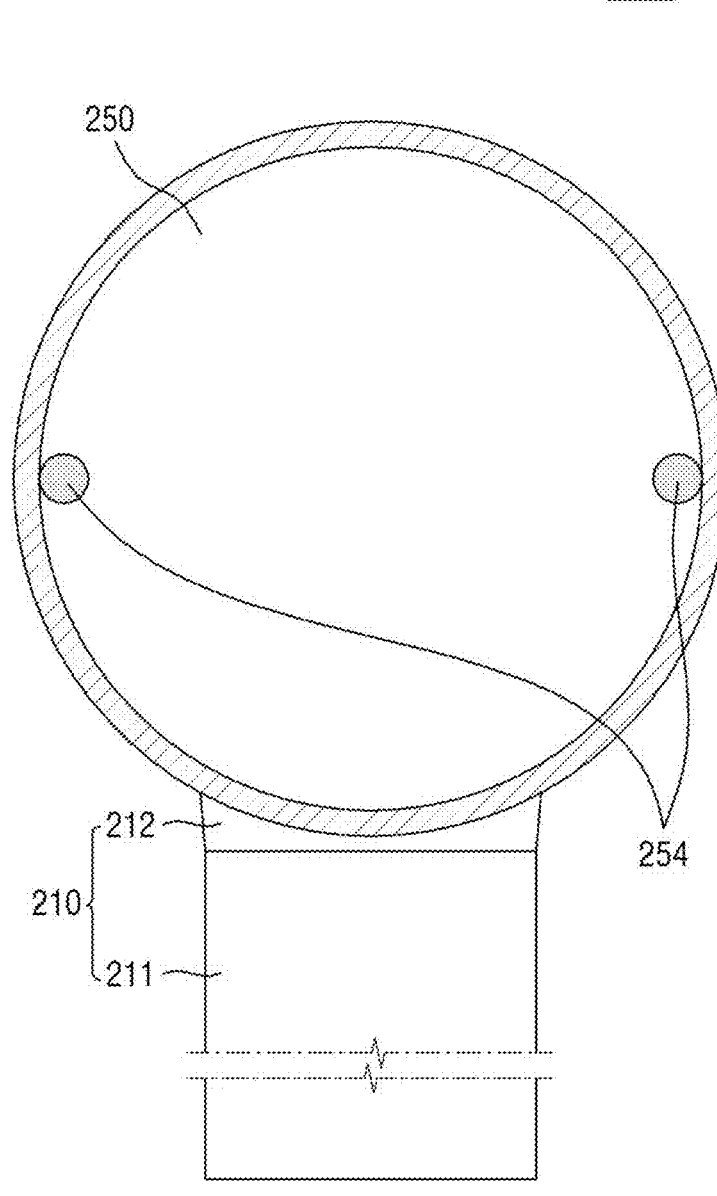

[FIG. 13]
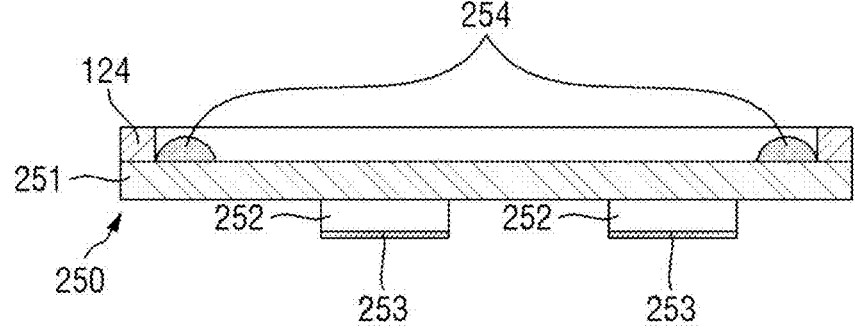
[FIG. 14]
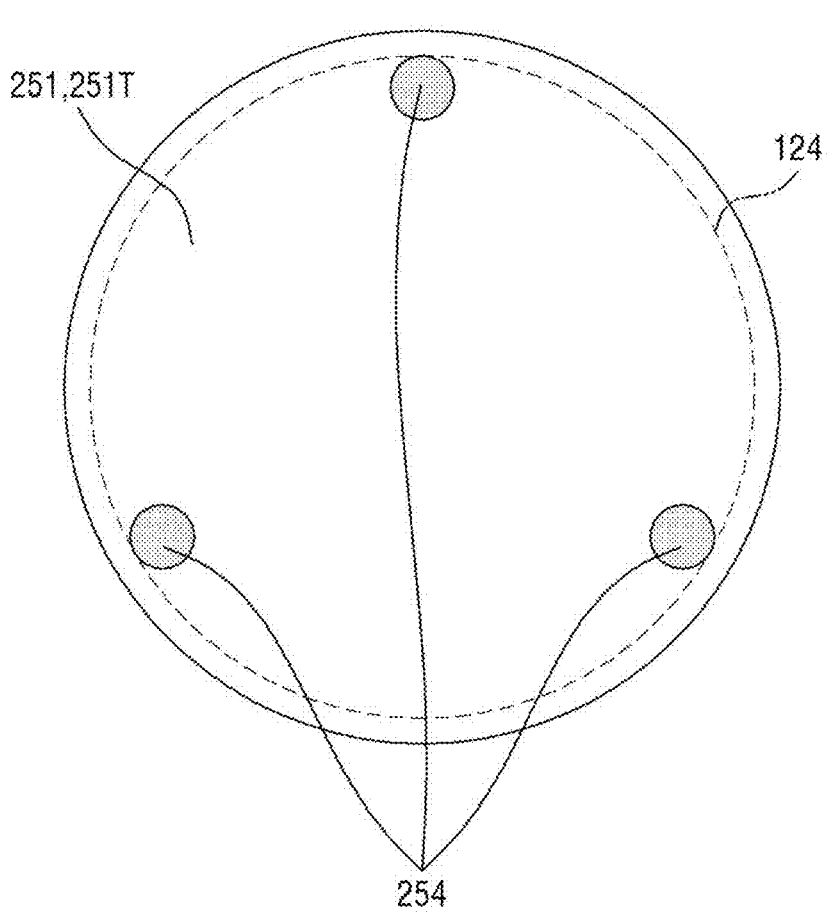

[FIG. 15]
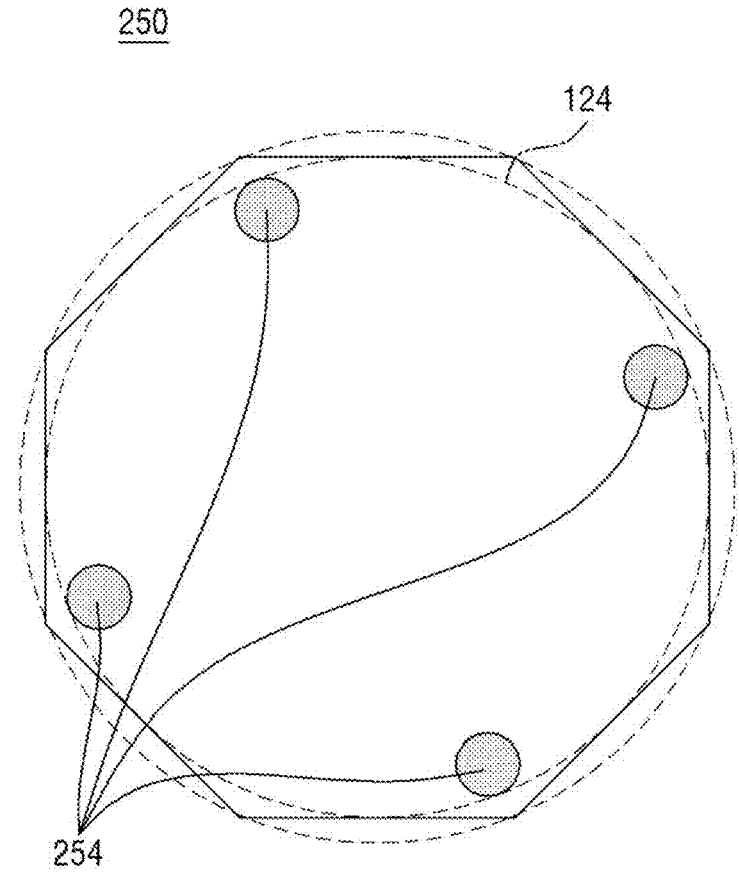
250

[FIG. 16]
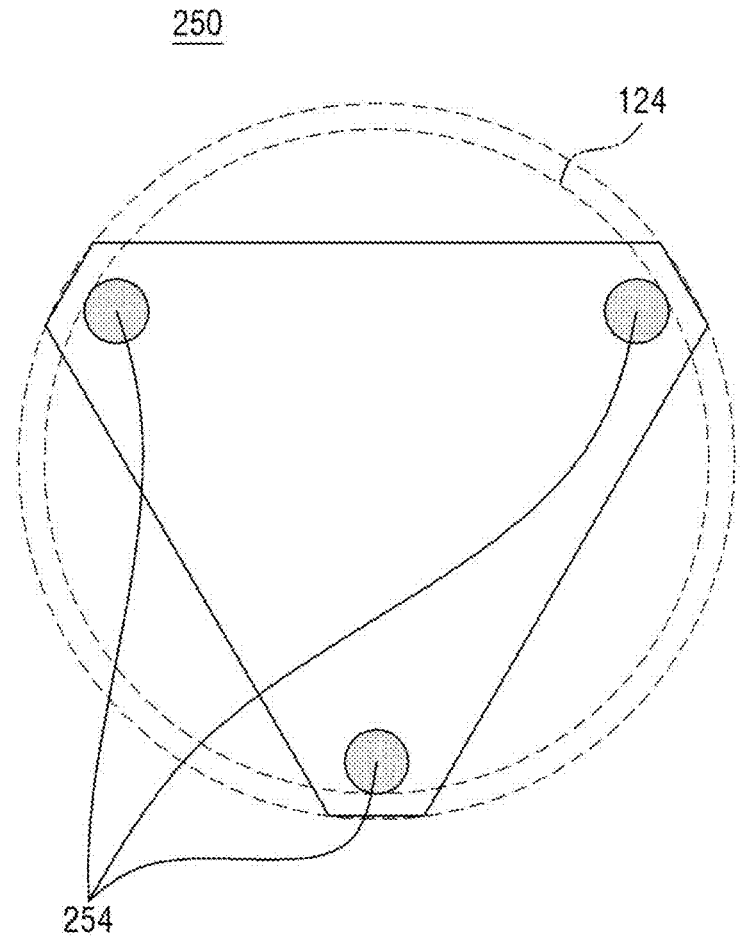
[FIG. 17]
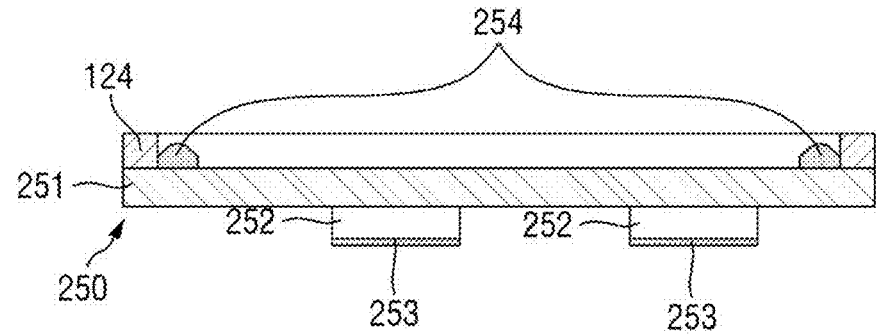

CARRIER FOR END EFFECTOR, TRANSPORTATION APPARATUS INCLUDING THE SAME AND THE SUBSTRATE PROCESSING APPARATUS

This application claims the benefit of Korean Patent Application No. 10-2022-0041027, filed on Apr. 1, 2022, in the Korean Intellectual Property Office, the disclosure of which is incorporated herein by reference in its entirety.

BACKGROUND

1. Field

The present invention relates to a carrier for an end effector, and a transporting apparatus and a substrate processing apparatus including the same.

2. Description of the Related Art

A semiconductor device can be manufactured by forming a predetermined pattern on a substrate. When a predetermined pattern is formed on a substrate, a plurality of processes, such as a deposition process, a lithography process, and an etching process, may be continuously performed in equipment used in a semiconductor manufacturing process.

SUMMARY

Meanwhile, the focus ring may be etched together with the substrate while the substrate is being etched. If the etching amount exceeds a certain level, replacement is required, and efforts to improve the transport of the ring-shaped member such as the focus ring are continuing.

The object of the present invention is to provide a carrier for an end effector that is easy to manufacture and has a simple structure, and can transport a ring-shaped member in a transport operation the same as or similar to that of a substrate, and a transporting apparatus and a substrate processing apparatus including the same.

The objects of the present invention are not limited to the objects mentioned above, and other objects not mentioned will be clearly understood by those skilled in the art from the following description.

One aspect of the transporting apparatus of the present invention for achieving the above object comprises an end effector including a hand and a plurality of vacuum holes installed in the hand; and a carrier located on the hand and for supporting a consumable part, wherein the carrier comprises one side for supporting a consumable part, the other surface facing the hand of the end effector, and a plurality of support blocks installed on the other surface and corresponding to the plurality of vacuum holes, wherein an inner space communicating with the vacuum hole is installed in the plurality of support blocks, and the inner space is evacuated by negative pressure provided from the plurality of vacuum holes.

One aspect of the substrate processing apparatus of the present invention for achieving the above other object comprises a chuck for supporting a substrate; and a transporting apparatus, wherein the transport apparatus comprises, an end effector including a hand and a plurality of vacuum holes installed in the hand; and a carrier located on the hand and for supporting a consumable part, wherein the carrier comprises one side for supporting a consumable part, the other surface facing the hand of the end effector, and a plurality of support blocks installed on the other surface and corresponding to the plurality of vacuum holes, wherein an inner space communicating with the vacuum hole is installed in the plurality of support blocks, and the inner space is evacuated by negative pressure provided from the plurality of vacuum holes, wherein the consumable part forms a ring shape and includes a ring-shaped member of a chuck, wherein the carrier has a circular shape having the same diameter as the consumable part, has a polygon shape, in which a corner is formed along a perimeter of the consumable part, or has a shape including an arc the same as an arc of the consumable part so as not to protrude from a perimeter of the consumable part, wherein a plurality of protrusion units are provided on one surface of the carrier, and the plurality of protrusion units are spaced apart from each other, protrude upward in contact with an inner circumferential surface of the consumable part to prevent horizontal movement of the consumable part, and formed the same as or lower than a height of the consumable part, wherein the transporting apparatus transports the ring member provided on the chuck.

One aspect of the carrier for the end effector of the present invention for achieving the above another object comprises a base unit including one surface supporting the consumable part and the other surface facing the hand so as to be located on an end effector including a hand, in which a plurality of vacuum holes are installed; and a plurality of support blocks installed on the other surface and corresponding to the plurality of vacuum holes, wherein, in the support block, an inner space in communication with the plurality of vacuum holes and evacuated by negative pressure provided from the plurality of vacuum holes is installed.

The details of other embodiments are included in the detailed description and drawings.

BRIEF DESCRIPTION OF THE DRAWINGS

These and/or other aspects will become apparent and more readily appreciated from the following description of the embodiments, taken in conjunction with the accompanying drawings in which:

FIG. 1 is a diagram illustrating a substrate processing apparatus according to some embodiments of the present invention;

FIG. 2 is a diagram illustrating a process chamber according to some embodiments of the present invention;

FIG. 3 is a plan view illustrating a transporting apparatus according to a first embodiment of the present invention;

FIG. 4 is a cross-sectional view taken along line H-H of FIG. 3;

FIG. 5 is a plan view showing the hand of the transporting apparatus according to the first embodiment of the present invention;

FIG. 6 is a side view showing the hand of the transporting apparatus according to the first embodiment of the present invention;

FIG. 7 is a cross-sectional view illustrating a lower portion of a cross-section taken along line A-A of FIG. 6;

FIG. 8 is a bottom view showing the hand of the transporting apparatus according to the first embodiment of the present invention;

FIG. 9 is a cross-sectional view taken along line B-B of FIG. 8;

FIG. 10 is a plan view illustrating a carrier according to a first embodiment of the present invention;

FIG. 11 is a cross-sectional view taken along line C-C of FIG. 10;

FIG. 12 is a plan view illustrating a transporting apparatus, on which a carrier is mounted, according to a second embodiment of the present invention;

FIG. 13 is a cross-sectional view illustrating a state, in which a ring member is installed on a carrier according to a second embodiment of the present invention;

FIG. 14 is a plan view illustrating a carrier according to a third embodiment of the present invention;

FIG. 15 is a plan view illustrating a carrier according to a fourth embodiment of the present invention;

FIG. 16 is a plan view illustrating a carrier according to a fifth embodiment of the present invention; and FIG. 17 is a cross-sectional view illustrating a state, in which a ring member is installed on a carrier, according to a sixth embodiment of the present invention.

DETAILED DESCRIPTION

Hereinafter, preferred embodiments of the present invention will be described in detail with reference to the accompanying drawings. Advantages and features of the present invention and methods of achieving them will become apparent with reference to the embodiments described below in detail in conjunction with the accompanying drawings. However, the present invention is not limited to the embodiments described below, but may be implemented in various different forms, and these embodiments are provided to make the description of the present invention complete, and fully inform those skilled in the art, to which the present invention pertains on the scope of the invention, and the present invention is only defined by the scope of the claims. Like reference numerals refer to like elements throughout. The singular also includes the plural, unless specifically stated otherwise.

The substrate processing apparatus 1 is installed in front of the equipment and has an index unit (equipment front end module (EFEM)) for transferring the substrate W between the vessel C, in which the substrate W is accommodated, and the process equipment (not shown) and the structure of the process chamber 100. Here, the process chambers 100 of the process equipment may be arranged in two rows with respect to the horizontal direction, and a substrate transporting apparatus 60 may be provided therebetween.

However, the present invention is not limited thereto. Hereinafter, the arrangement of the process chamber 100 of the substrate processing apparatus 1 is provided along the circumference of the transfer chamber 50.

FIG. 1 is a diagram illustrating a substrate processing apparatus according to some embodiments of the present invention.

Referring to FIG. 1, a substrate processing apparatus 1 may include a load port 10, a substrate transfer module 200, a load lock chamber 30, a transfer chamber 50, and a process chamber 100.

The load port 10 is a front end module, and can transfer wafers in an atmospheric state. A container C, in which a plurality of substrates W (see FIG. 2) processed in the process chamber 100 are loaded, may be placed in the load port 10 by an automated system (not shown). The container C is a means for accommodating a plurality of substrates W, on which the same process is performed, in a predetermined number and transferring them to each process equipment, and a Front Opening Unified Pod (FOUP) may be used.

The substrate transfer module 200 may be disposed adjacent to the load port 10, on which the container C is placed. The substrate transfer module 200 may transfer the substrate W between the container C placed on the load port

10 and the load lock chamber using the transporting apparatus 200A. The substrate transfer module 200 will be described later with reference to FIGS. 3 and 4.

The load lock chamber 30 may be disposed at a rear end of the substrate transfer module 200. The load lock chamber 30 may include a loading chamber 31 and an unloading chamber 32. In the loading chamber 31, the substrate W flowing into the process chamber 100 may temporarily stay for the process to proceed. In the unloading chamber 32, the substrate W flowing out from the process chamber 100 after the process is completed may temporarily stay there. When the substrate W is transferred into the load lock chamber 30, a controller (not shown) depressurizes the inside of the load lock chamber 30 to make an initial low vacuum state, and through this, it is possible to prevent external contaminants from inflowing into the process chamber 100 and the transfer chamber 50.

The transfer chamber 50 may be disposed adjacent to one side of the load lock chamber 30. One or more process chambers 100 may be arranged in a predetermined arrangement around the transfer chamber 50.

The transfer chamber 50 is disposed between the load lock chamber 30 and the process chamber 100 and can play a role in transferring a substrate W between one or more process chambers 100 or between the load lock chamber 30 and one or more process chambers 100. At least one substrate transfer device 60 for transferring the substrate W may be provided inside the transfer chamber 50.

The substrate transfer device 60 may include a robot arm (reference numeral not shown) and an arm blade (reference numeral not shown) that can be operated by a driving means such as a stepping motor.

The process chamber 100 may be provided as a plurality of chambers for performing various substrate W processes. For example, the process chamber 100 may perform an etching process, a chemical vapor deposition process, an ashing process, and a cleaning process. Hereinafter, it will be exemplarily described that the process chamber 100 processes the substrate W using an etching process (e.g., a dry etching process) in a vacuum environment. And, in this embodiment, the arrangement of the process chamber 100 is to illustrate that it is provided along the circumference of the transfer chamber 50.

Hereinafter, the process chamber 100 and the transporting apparatus 200A will be described with reference to drawings related to each description.

FIG. 2 is a diagram illustrating a process chamber according to some embodiments of the present invention.

Referring to FIG. 2, the process chamber 100 may include a chamber body 110, a substrate support unit 120, a gas supply unit 130, a plasma source 140, and a baffle 150.

However, in the present embodiment, the plasma processing of the process chamber 100 is described as an inductive coupled plasma (ICP) equipment as an example, but this is only an example. In other words, it should be noted that the process chamber 100 may be provided as a capacitive coupled plasma (CCP) equipment, a microwave plasma equipment, or other various plasma processing apparatuses for plasma processing.

The chamber body 110 may provide a processing space, in which the substrate W is processed. The chamber body 110 may be provided in a cylindrical shape, a polygonal shape or a cylindrical shape. An opening (not shown) may be formed in the chamber body 110. The opening may form a passage, through which the substrate W is carried in or out.

An exhaust hole (not shown) may be formed in the bottom surface of the chamber body 110. The exhaust hole may be connected to the pump through an exhaust line. The pump may provide vacuum pressure to the exhaust hole through the exhaust line. By-products generated during the process and plasma staying in the chamber body 110 may be discharged to the outside of the chamber body 110 by vacuum pressure.

The substrate support unit 120 may support the substrate W in the processing space. The substrate support unit 120 may be provided as an electrostatic chuck for supporting the substrate W using an electrostatic force. As another example, the substrate support unit 120 may support the substrate W in various ways such as mechanical clamping. In other words, the substrate support unit 120 may be formed of a chuck such as an electrostatic chuck for supporting the substrate W.

The substrate support unit 120 may include a support 121, a lower member 122, a lift pin unit 123, and a ring member (which may be a focus ring 124).

The support 121 may be provided as a dielectric plate. A substrate W may be disposed on the upper surface of the dielectric plate. The dielectric plate may be provided, for example, in the shape of a disk. The dielectric plate may have a smaller radius than the substrate W. A lower electrode 121A may be installed inside the dielectric plate. A heater 121B for heating the substrate W may be installed inside the dielectric plate. The heater 121B may be provided as a spiral coil.

The lower member 122 may have a dielectric plate provided thereon to support the dielectric plate. The lower member 122 may be coupled to the dielectric plate to be fixed. The upper surface of the lower member 122 may have a stepped shape such that the central region thereof is higher than the edge region.

A cooling passage 122A may be formed in the lower member 122. The cooling passage 122A may be provided as a passage, through which the cooling fluid circulates. A high frequency power source (not shown) is provided outside the lower member 122, and the high frequency power source may apply power to the lower member 122. The electric power applied to the lower member 122 may guide the plasma generated in the chamber body 110 to move toward the lower member 122. The lower member 122 may be made of a metal material.

The lift pin unit 123 may include a lift pin 123A and a pin driving member (not shown). The lift pin 123A may be provided so that its longitudinal direction is directed to the vertical direction. A plurality of lift pins 123A may be provided, and each of the lift pins 123A may be disposed in a pinhole. The lift pin 123A may move up and down to protrude from the pinhole.

The pin driving member moves the plurality of lift pins 123A in the vertical direction. The pin driving member may move up and down while the plurality of lift pins 123A maintain the same height. The lift pin unit 123 may raise and lower the substrate W by elevating the lift pin 123A by the pin driving member.

The ring member may be provided with a focus ring 124. The focus ring 124 may focus plasma to the substrate W. The focus ring 124 may include an outer ring 1241 and an inner ring 1242.

The outer ring 1241 may be provided in an annular ring shape surrounding the inner ring 1242. The outer ring 1241 may be located adjacent to the inner ring 1242 in an edge region of the lower member 122.

The inner ring 1242 may be provided in an annular ring shape surrounding the dielectric plate. The inner ring 1242 may have a step, so that it may have an inner region 1242A provided at the same height as the upper surface of the dielectric plate and an outer region 1242B having a height higher than that of the inner region 1242A. The inner region 1242A of the inner ring 1242 provided at the same height as the height of the dielectric plate may support the bottom edge region of the substrate W.

In addition, the time required for the cleaning process of the focus ring 124, that is, MTBC (Mean Time Between Cleaning) may be determined by the inner region 1242A of the inner ring 1242. However, the inner ring 1242 may be etched together with the substrate W by an etching process performed in the processing space. If the process of processing the substrate W is repeatedly performed, the etch amount of the focus ring 124 gradually increases, and replacement is required.

If replacement of the focus ring 124 is necessary, the focus ring 124 may be transported/replaced by a ring driving device (not shown) and a transporting apparatus 200A.

Here, for example, the ring driving device may drive the focus ring 124 up and down. A pin structure (not shown) for moving the focus ring 124 up and down may be provided in the driving device. When the focus ring 124 needs to be replaced, the focus ring 124 may be raised and lowered by a pin included in the driving device. When the focus ring 124 is raised and lowered, a hand (not shown) of the substrate transfer device 60 is inserted into the bottom surface of the focus ring 124 to receive the focus ring 124 from a pin. After the substrate transfer device 60 receives the focus ring 124, the substrate transfer device 60 may transfer the focus ring 124 to the transporting apparatus 200A.

The gas supply unit 130 may supply a process gas onto the substrate W supported by the substrate support unit 120. The gas supply unit 130 may include a gas storage unit 131 for storing gas, a gas supply line 132, through which the gas passes, and a gas inlet port (not shown) for introducing gas into the processing space.

The plasma source 140 may excite the process gas in the chamber body 110 into a plasma state. For example, the plasma source 140 may be an inductively coupled plasma (ICP) source. The plasma source 140 may include an antenna 141 and an external power source (not shown). However, the present invention is not limited thereto.

The baffle 150 may control the flow rate of plasma exhausted to the outside of the chamber body 110. The baffle 150 may be located between the inner wall of the chamber body 110 and the support unit 140 in the processing space. The baffle 150 is provided in an annular ring shape. A plurality of through holes provided along the circumferential direction of the baffle 150 may be formed in the baffle 150.

Hereinafter, the transporting apparatus 200A will be described with reference to the drawings.

FIGS. 3 and 4 are diagrams for describing a transporting apparatus according to the first embodiment of the present invention. FIGS. 5 to 9 are views for describing the hand of the transporting apparatus according to the first embodiment of the present invention. FIGS. 10 and 11 are diagrams for describing a carrier according to the first embodiment of the present invention.

Referring to FIGS. 3 to 11, the transporting apparatus 200A may include an end effector 210 and a carrier 250.

Briefly, the transporting apparatus 200A may transport the substrate W by attaching it to the substrate W by adsorption according to vacuum. In addition, the transporting apparatus 200A of the present embodiment may adsorb the carrier 250 and transport consumable parts by arranging it on the carrier 250 in the same or similar manner to the operation of adsorbing and transporting the substrate W. The consumable part may have a ring-shape. For example, the consumable part may include a focus ring 124 that is a ring-shaped member of the chuck (substrate support unit 120).

Specifically, the end effector 210 may be provided with a robot arm 211 and a hand 212, and may include a plurality of vacuum holes 212B installed in the hand 212.

The robot arm 211 is configured to be connected to the hand 212 and operate the hand 212. The robot arm 211 may have a structure capable of horizontal movement and vertical height adjustment of the hand 212. For example, the robot arm 211 may have a multi joint structure so as to be able to move and/or rotate in a horizontal direction. And the robot arm 211 may form a structure, in which a motor, a gear, a belt, etc. are combined for operation in a horizontal direction. In addition, the robot arm 211 is provided with a cylinder and a piston structure, and the vertical height may be adjusted by adjusting the protrusion length of the piston.

In addition, the robot arm 211 may have a vacuum path 211A in communication with a pump (not shown) for forming a vacuum so that the hand 212 is adsorbed with the substrate W and the carrier 250 in a vacuum manner (see FIG. 4).

The hand 212 is configured to support the substrate W or the carrier 250. The hand 212 may be mechanically connected to the robot arm 211, which will be omitted in lieu of a known technique. The hand 212 may communicate with the vacuum path 211A of the robot arm 211 so as to be absorbed with the substrate W or the carrier 250 in a vacuum manner.

For example, referring to FIG. 5, the hand 212 may have a shape such as a 'U.' In other words, a structure, in which a pair of blades is formed at the end, may be achieved. And referring to FIG. 7 (which may be in the same viewing direction as the bottom view of FIG. 8), vacuum holes 212B are located at each vertex of a virtual U (or V) in the hand 212, and the negative pressure can be provided at three points. The plurality of vacuum holes 212B may communicate with each other by a single vacuum line 212A (both ends may have a branched structure) so that negative pressure is simultaneously provided. However, this is only an example.

In addition, referring to FIG. 7, the vacuum line 212A is exemplified in a 'y' shape (or left and right inverted 'y' shape) with respect to the lower viewing direction, and a vacuum hole 212B is formed to extend in a right-angle direction from the 'y'-shaped vacuum line 212A. However, the shape of the vacuum line 212A is not limited thereto, and variations of the shape such as 'Y' may be varied.

In addition, in the hand 212, a communication hole 212BB extending in a right-angle direction from the vacuum line 212A may be formed at a position spaced apart from the vacuum hole 212B in the vacuum line 212A (which may be a 'y'-shaped end). The communication hole 212BB is a configuration, in which the vacuum line 212A communicates with the vacuum path 211A of the robot arm 211 (see FIG. 4).

In other words, the vacuum hole 212B of the hand 212 may form an inlet for sucking a fluid (which may be a gas such as air) from the inner space 252S. And the communication hole 212BB of the hand 212 may be the outlet of the fluid so that the fluid introduced through the vacuum hole 212B flows into the vacuum path 211A of the robot arm 211 via the vacuum line 212A.

In addition, in the hand 212, although not shown in the drawings, a separate pad (not shown) is further provided on the surface (which may be an upper surface) of the hand 212 at the position of the vacuum hole 212B according to a modification of the embodiment. The pad may have a ring shape formed along the circumference of the vacuum hole 212B so that the negative pressure of the vacuum hole 212B directly acts on the substrate W.

The pad of the hand 212 may have the same diameter as the contact pad 253 and may be provided to abut vertically. Alternatively, various modifications are possible such as the pad of the hand 212 may be formed smaller than the inner diameter of the contact pad 253, and the pad of the hand 212 and the contact pad 253 may be arranged inside and outside. In addition, the pad of the hand 212 may be made of an elastic material or a soft material in the same or similar manner to the contact pad 253 to be described later.

The carrier 250 may be located on hand 212 and may support a consumable part, as shown in FIGS. 3 and 4. For example, the carrier 250 may include a base unit 251, a support block 252, and a contact pad 253.

The base unit 251 may form the exterior of the carrier 250. In other words, one surface 251T of the base unit 251 may form one surface of the carrier 250, and the other surface 251B of the base unit 251 may form the other surface of the carrier 250. Here, one surface of the carrier 250 may be an upper surface. And the other surface of the carrier 250 may be a lower surface as the opposite surface of the one surface of the carrier 250.

One surface 251T of the base unit 251 may support a consumable part. In other words, a consumable part may be placed on the upper portion of the base unit 251. The other surface 251B of the base unit 251 may face the hand 212 and may be located on the end effector 210. That is, the other surface 251B of the base unit 251 may face the hand 212, in which the plurality of vacuum holes 212B are installed.

The base unit 251 may be formed in the form of a plate, and the plate may have a shape that does not protrude from the perimeter of the consumable part. As an example, the base unit 251 may be formed in a circular shape having the same diameter as that of the consumable part as shown in FIGS. 3 and 10. However, the present invention is not limited thereto, and another embodiment will be described later with reference to FIGS. 15 and 16.

The support block 252 is configured to increase the adsorption force between the end effector 210 and the carrier 250.

The shape of the support block 252 is not particularly limited, and various modifications are possible as long as the structure is evacuated by the negative pressure provided from the vacuum hole 212B. The support block 252 may have a structure, in which the lower end is opened and the upper end is closed so that the lower end of the inner space 252S, which will be described later, is opened. For example, the support block 252 may be formed of a columnar structure, such as a cylindrical column, a square column, or a hexagonal column.

The support block 252 may be installed on the other surface 251B of the base unit 251 so as to be in contact with the end effector 210. The support block 252 may correspond to a plurality of vacuum holes 212B on the other surface 251B of the base unit 251. In other words, the support block 252 may be provided at a position facing the vacuum hole 212B on the other surface 251B of the base unit 251 facing the end effector 210.

The support block 252 may be provided with an internal space 252S to be adsorbed by vacuum. The inner space 252S may be formed as a space concave from the lower portion of the support block 252 to the upper portion. That is, the inner space 252S may form an open space in the lower portion at the support block 252. The lower portion of the inner space 252S is opened so that each of the support blocks 252 communicates with each of the vacuum holes 212B. The inner space 252S of the support block 252 may have a larger diameter than the diameter of the vacuum hole 212B.

The inner space 252S may communicate with the plurality of vacuum holes 212B at the positions facing the vacuum holes 212B, for example, in an environment of an atmospheric pressure, and may be evacuated by the negative pressure provided from the plurality of vacuum holes 212B. The negative pressure provided from the vacuum hole 212B may be the same as or similar to the negative pressure provided to adsorb the substrate W. That is, the operation for transporting the substrate W of the general end effector 210 may be applied in the same as or similar to the operation for transporting the consumable parts. Accordingly, even if the end effector 210 has a different object to be transported, such as the substrate W or a consumable part, control according to the object to be transported is not different, so that the logic for controlling the end effector 210 may be simple.

A contact pad 253 may be installed on the surface of the support block 252. However, the contact pad 253 may be omitted in some embodiments.

The contact pad 253 may seal the inner space 252S when the inner space 252S is evacuated. In addition, when the internal space 252S is evacuated, the surface (which may be the lower surface) of the contact pad 253 may be in close contact with the end effector 210. Exemplarily, the contact pad 253 may be made of an elastic material or a soft material, and may be made of a rubber or silicone material. Various methods for installing the contact pad 253 are possible, for example, an adhesive is provided between the surface of the support block 252 and the contact pad and the contact pad is attached in an adhesive manner or liquid rubber or silicone is attached to the surface of the support block 252 in an application manner.

The contact pad 253 may have a ring (doughnut) shape surrounding the perimeter of the inner space 252S to open the lower end of the inner space 252S. The diameter of the contact pad 253 may be the same as or larger than the inner diameter of the inner space 252S.

Hereinafter, a modified example of the present embodiment will be described with reference to FIGS. 12 to 17, and an overlapping description of the same configuration having the same function will be omitted.

FIGS. 12 and 13 are diagrams for describing a carrier according to a second embodiment of the present invention. With reference to FIGS. 12 and 13, points different from those described with reference to FIGS. 3 and 4 will be mainly described.

Referring to FIGS. 12 and 13, the transporting apparatus 200A may include an end effector 210 and a carrier 250.

The carrier 250 according to the second embodiment may further include a protrusion unit 254.

The protrusion unit 254 may be provided on one surface 251T of the base unit 251. The protrusion unit 254 is configured to prevent horizontal movement of the consumable part, and may protrude upward to abut the inner circumferential surface of the consumable part.

A plurality of protrusion units 254 may be provided to prevent horizontal movement of the consumable parts in multiple directions. The plurality of protrusion units 254 may be provided to be spaced apart from each other. The consumable part forms a ring shape, and the protrusion unit 254 may be provided at a position in contact with the inner circumferential surface of the ring-shaped consumable part.

Exemplarily, two protrusion units 254 may be provided. In this case, the protrusion units 254 may be disposed in opposite directions, and, for example, may be provided on the left side (9 o'clock direction) and the right side (3 o'clock direction) on one surface 251T of the base unit 251.

The protrusion unit 254 provided on the left side of the base unit 251 comes in contact with the inner circumferential surface of the consumable part at the left side position of the consumable part, and blocks the rightward path of the consumable part, so that the right movement of the consumable part can be prevented.

In addition, the protrusion unit 254 provided on the right side of the base 251 is in contact with the inner circumferential surface of the consumable part at the right side position of the consumable part, and blocks the leftward path of the consumable part, so that the left movement of the consumable part can be prevented.

In addition, the two projection units 254 may prevent movement of the consumable parts in the 12 o'clock and 6 o'clock directions (and may include other directions). This is because the two protrusion units 254 are spaced apart from each other in the left and right directions, and are provided at a position where the separation distance is maximized, so that a sufficient space is not formed, in which the consumable parts can be moved.

In other words, the protrusion unit 254 provided on the left (9 o'clock) and right (3 o'clock) sides of the one surface 251T of the base unit 251 is located at the maximum width of the base unit 251 within the radius of the consumable part. And thus, the width of the consumable part and the base unit 251 is reduced in the 12 o'clock and 6 o'clock directions based on the imaginary line extending from the 9 o'clock to the 3 o'clock direction, and movement at the 12 o'clock and 6 o'clock directions can also be blocked. The movement between the 9 o'clock direction and the 12 o'clock direction and between the 12 o'clock direction and the 3 o'clock direction is also blocked by the same or similar manner.

Also, the protrusion unit 254 may have a curved upper portion. Alternatively, the protrusion unit 254 may have an inclined corner/inclined surface (see FIG. 17). This is for the protrusion 254 to gently guide the consumable part.

That is, when the consumable part is seated on the carrier 250, the position of the consumable part may be shifted from the proper position of the carrier 250 due to an operation error of the robot arm 211 and the hand 212. However, while guided along the curved surface (or inclined corner/inclined surface) of the protrusion unit 254, the consumable part of this embodiment can be seated in the proper position in the process of moving until it comes into contact with the side surfaces of the two (or more) protrusion units 254.

In addition, there may be more than two protrusions 254. This will be described below with reference to the drawings.

FIG. 14 is a plan view illustrating a carrier according to a third embodiment of the present invention. With reference to FIG. 14, points different from those described with reference to FIGS. 12 and 13 will be mainly described.

Referring to FIG. 14, the transporting apparatus 200A may include an end effector 210 and a carrier 250.

The carrier 250 according to the third embodiment may further include a protrusion unit 254 similar to the second embodiment.

However, the number of protrusion units 254 in the third embodiment may be three or more. And, since the restriction of the protrusion unit 254 of the third embodiment to the horizontal movement of the consumable part may be made by the same mechanism as the two protrusion units 254 described above, the overlapping description will be omitted.

Two or more protrusion units 254 provided, such as three and four, may have a maximum separation distance from each other, and may be arranged at equal intervals. However, since the protrusion unit 254 prevents horizontal movement of the consumable part in multiple directions, the arrangement of the protrusion unit 254 may be variously made if this does not conflict with this.

In addition, the protrusion unit 254 may be made so that no restrictions are applied to the design of the storage box and/or the container C, in which the consumable parts are transferred. For example, the protrusion unit 254 may be formed so as not to protrude more than the consumable parts so that the loaded number of consumable parts can be maximized with respect to the storage box of the same height. For example, the protrusion unit 254 may be formed to be the same as the height of the consumable part or lower than the height of the consumable part.

Hereinafter, a modified example of the shape of the carrier 250 will be described.

FIG. 15 is a plan view illustrating a carrier according to a fourth embodiment of the present invention, and FIG. 16 is a plan view illustrating a carrier according to a fifth embodiment of the present invention. With reference to FIGS. 15 and 16, points different from those described with reference to FIGS. 12 to 14 will be mainly described.

Referring to FIGS. 15 and 16, the transporting apparatus 200A may include an end effector 210 and a carrier 250.

The base unit 251 of the fourth and fifth embodiments may be formed in a polygonal shape, in which corners are formed along the perimeter of the consumable part. The shape of the polygon is not limited as long as it can support the consumable part, and may include any shape such as a triangle, a square, a pentagon, a hexagon, or a shape in which the corners of a polygon are chamfered. In addition, each corner of the polygon may form a curved surface to correspond to the arc of the ring member (focus ring 124).

In addition, the base unit 251 is not limited to circular and polygonal shapes, and may have a modified example having a shape including the same arc as the arc of the consumable part.

Hereinafter, a modified example of the protrusion unit 254 will be described with reference to the drawings.

FIG. 17 is a cross-sectional view illustrating a state, in which a ring member is installed on a carrier according to a sixth embodiment of the present invention. Referring to FIG. 17, points different from those described with reference to FIGS. 12 to 16 will be mainly described.

Referring to FIG. 17, the transporting apparatus 200A may include an end effector 210 and a carrier 250. The protrusion unit 254 of the sixth embodiment is formed with an inclined surface (reference numeral not shown) upward from one side facing the inner circumferential surface of the consumable part to the other side, or an inclined corner to guide the consumable part. As such, the protrusion unit 254 may have various modifications.

Although the embodiments of the present invention have been described above with reference to the accompanying drawings, the present invention is not limited to the above embodiments, but may be manufactured in a variety of different forms, and those of ordinary skill in the art to which the present invention pertains can understand that the present invention may be embodied in other specific forms without changing the technical spirit or essential features of the present invention. Therefore, it should be understood that the embodiments described above are illustrative in all respects and not limiting.

REFERENCE NUMERAL

1: substrate processing apparatus 10: load port
30: load lock chamber 50: transfer chamber
100: process chamber 110: chamber body
120: substrate support unit 124: focus ring
200: substrate transfer module 200A: transporting apparatus
210: end effector 211: robot arm
212: hand 250: carrier
252: support block 252S: inner space
What is claimed is:

1. A transporting apparatus comprising:
an end effector that comprises a hand, the hand comprising a plurality of vacuum holes; and
a carrier located on the hand and for supporting a consumable part that is being transported by the transporting apparatus using the carrier, wherein the carrier comprises:
a first surface for supporting a consumable part,
a second surface opposite to the first surface, wherein the second surface faces the hand of the end effector and faces away from the consumable part, and
a plurality of support blocks installed on the second surface and at positions that correspond to the plurality of vacuum holes, wherein the plurality of support blocks are separated from the consumable part by the carrier,
wherein each of the plurality of support blocks comprises an inner space that communicates with at least one of the plurality of vacuum holes, and the inner space of each of the plurality of support blocks is evacuated by negative pressure provided from the at least one of the plurality of vacuum holes.

2. The transporting apparatus of claim 1, wherein a contact pad is further installed on a surface of each of the plurality of support blocks.

3. The transporting apparatus of claim 2, wherein the contact pad is made of an elastic material or a soft material so that the inner space is sealed by evacuating the inner space, and the contact pad forms a ring shape having a diameter that is a same diameter as or a larger diameter than an inner diameter of the inner space.

4. The transporting apparatus of claim 1,
wherein the consumable part forms a ring shape,
wherein the carrier has a circular shape having a same diameter as the consumable part, has a polygon shape, in which a corner is formed along a perimeter of the consumable part, or has a shape including an arc identical to an arc of the consumable part so as not to protrude from a perimeter of the consumable part.

5. The transporting apparatus of claim 1, wherein the consumable part is a ring-shaped member of a chuck.

6. The transporting apparatus of claim 5, wherein the transporting apparatus further comprises:
a plurality of protrusion units that:
are provided on the first surface of the carrier,
are spaced apart from one another, and
protrude upward in contact with an inner circumferential surface of the consumable part to prevent horizontal movement of the consumable part.

7. The transporting apparatus of claim 6, wherein each of the plurality of protrusion units comprises a same height or a lower height than a height of the consumable part.

8. The transporting apparatus of claim 6, wherein each of the plurality of protrusion units is formed with an inclined surface or an inclined corner upward in a direction from a first side of each of the plurality of protrusion units that faces the inner circumferential surface of the consumable part to a second side of each of plurality of protrusion units that faces away from the inner circumferential surface to guide the consumable part.

9. The transporting apparatus of claim 6, wherein each of the plurality of protrusion units has a curved upper portion.

10. The transporting apparatus of claim 1, wherein one of the inner space of the plurality of support blocks has a diameter greater than a diameter of one of the plurality of vacuum holes.

11. An apparatus for processing a substrate comprising:
a chuck for supporting a substrate; and
a transporting apparatus, wherein the transport apparatus comprises:
    an end effector that comprises a hand, the hand comprising a plurality of vacuum holes; and
    a carrier located on the hand and for supporting a consumable part, wherein the carrier comprises:
        a first surface for supporting a consumable part that is being transported by the transporting apparatus using the carrier,
        a second surface opposite to the first surface, wherein the second surface faces the hand of the end effector and faces away from the consumable part, and
        a plurality of support blocks installed on the second surface and at positions that correspond to the plurality of vacuum holes, wherein the plurality of support blocks are separated from the consumable part by the carrier,
        wherein each of the plurality of support blocks comprises an inner space that communicates with at least one of the plurality of vacuum holes, and the inner space of each of the plurality of support blocks is evacuated by negative pressure provided from the at least one of the plurality of vacuum holes,
        wherein the consumable part comprises a ring shape and is a ring-shaped member of a chuck,
        wherein the carrier has a circular shape having a same diameter as the consumable part, has a polygon shape, in which a corner is formed along a perimeter of the consumable part, or has a shape including an arc identical to an arc of the consumable part so as not to protrude from a perimeter of the consumable part,
        wherein a plurality of protrusion units are provided on the first surface of the carrier and spaced apart from one another, each of the plurality of protrusion units protrudes upward in contact with an inner circumferential surface of the consumable part to prevent horizontal movement of the consumable part, and the plurality of protrusion units comprise a same height or a lower height than a height of the consumable part,
        wherein the transporting apparatus transports the ring-shaped member to the chuck.

12. A carrier for an end effector comprising:
a base unit comprising a first surface that supports a consumable part that is being transported by a transporting apparatus using the carrier and a second surface opposite to the first surface, wherein the second surface faces a hand of the end effector and faces away from the consumable part, and wherein the hand comprises a plurality of vacuum holes; and
a plurality of support blocks installed on the second surface and at positions that correspond to the plurality of vacuum holes, wherein the plurality of support blocks are separated from the consumable part by the carrier,
wherein each of the plurality of support blocks comprises an inner space that communicates with at least one of the plurality of vacuum holes, and the inner space of each of the plurality of support blocks is evacuated by negative pressure provided from the at least one of the plurality of vacuum holes.

13. The carrier of claim 12,
wherein a contact pad is further installed on a surface of each of the plurality of support blocks, and
wherein the contact pad is made of an elastic material or a soft material so that the inner space is sealed by evacuating the inner space, and the contact pad forms a ring shape having a diameter that is a same diameter as or a larger diameter than an inner diameter of the inner space.

14. The carrier of claim 12,
wherein the consumable part forms a ring shape,
wherein the base unit has a circular shape having a same diameter as the consumable part, has a polygon shape, in which a corner is formed along a perimeter of the consumable part, or has a shape including an arc identical to an arc of the consumable part so as not to protrude from a perimeter of the consumable part.

15. The carrier of claim 12, wherein the carrier further comprises:
a plurality of protrusion units that:
    are provided on the first surface of the carrier,
    are spaced apart from one another, and
    protrude upward in contact with an inner circumferential surface of the consumable part to prevent horizontal movement of the consumable part.

16. The carrier of claim 15, wherein each of the plurality of protrusion units comprises a same height or a lower height than a height of the consumable part.

17. The carrier of claim 15, wherein each of the plurality of protrusion units is formed with an inclined surface or an inclined corner upward in a direction from a first side of each of the plurality of protrusion units that faces the inner circumferential surface of the consumable part to a second side of each of plurality of protrusion units that faces away from the inner circumferential surface to guide the consumable part.

18. The carrier of claim 15, wherein each of the plurality of protrusion units has a curved upper portion.

19. The carrier of claim 12, wherein one of the inner space of the plurality of support blocks has a diameter greater than a diameter of one of the plurality of vacuum holes.

20. The carrier of claim 12, wherein the consumable part is a ring-shaped member of a chuck.

\* \* \* \* \*